(12) United States Patent
Hirose et al.

(10) Patent No.: US 8,422,523 B2
(45) Date of Patent: Apr. 16, 2013

(54) LASER LIGHT-SOURCE APPARATUS AND PROJECTOR APPARATUS

(75) Inventors: Tatsuro Hirose, Tokyo (JP); Taisuke Murata, Tokyo (JP); Kazuo Kadowaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/021,108

(22) Filed: Feb. 4, 2011

(65) Prior Publication Data

US 2011/0194578 A1     Aug. 11, 2011

(30) Foreign Application Priority Data

Feb. 5, 2010   (JP) ................................. 2010-024427

(51) Int. Cl.
*H01S 3/04* (2006.01)

(52) U.S. Cl.
USPC .......................................................... 372/36

(58) Field of Classification Search .................... 257/99; 372/36, 34, 35; 156/67
See application file for complete search history.

(56) References Cited

U.S. PATENT DOCUMENTS

2002/0110165 A1* 8/2002 Filgas ............................. 372/36
2009/0175740 A1* 7/2009 Morimoto et al. ............. 417/312

FOREIGN PATENT DOCUMENTS

| JP | 7-178957 A | | 7/1995 |
|---|---|---|---|
| JP | 2002-151784 A | | 5/2002 |
| JP | 2003-218448 | * | 7/2003 |
| JP | 2003-218448 A | | 7/2003 |

* cited by examiner

*Primary Examiner* — Jessica Stultz
*Assistant Examiner* — Tuan Nguyen
(74) *Attorney, Agent, or Firm* — Birch, Stewart, Kolasch & Birch, LLP (57) ABSTRACT

A laser light-source apparatus according to the present invention is equipped with: a laser-driving circuit board, thermal insulators that are placed on the laser-driving circuit board; a heat receiving plate that is placed on the thermal insulators and thermally insulated from the laser-driving circuit board, a laser light-source module that is installed on the heat receiving plate so as to be thermally connected to the heat receiving plate and is also electrically connected to the laser-driving circuit board so as to be driven thereby, and a heat sink that is thermally connected to the heat receiving plate via a heat pipe.

9 Claims, 6 Drawing Sheets

LASER LIGHT-SOURCE APPARATUS AND PROJECTOR APPARATUS

BACKGROUND OF THE INVENTION

1. Field of the Invention

The present invention relates to a laser light-source apparatus and a projector apparatus.

2. Description of the Related Art

Recently, it is proposed that a laser light source is used as a light source for a projector apparatus. The laser light source has such advantages, for example, as that it has a color reproduction range wider than an extra-high pressure mercury lamp, which is used in conventional projector apparatuses; that it can instantly illuminate; that it has a low power consumption; and that it has a long product life.

Along with downsizing and weight reduction of projector apparatuses, while a light source also needs to satisfy a similar requirement, an amount of light to be supplied has increased for a shift to a larger screen and a higher intensity of a projector device, so that improvement in heat-radiation efficiency of a light source is made an important technical task. Moreover, because the laser light source varies its emitted-light wavelengths and its laser outputs depending on a change in temperature of a light emitting unit, it needs to achieve stabilization of laser output by appropriately cooling in accordance with specifications of the light emitting unit.

For this reason, in addition to a conventional air-cooling system, it is desirable to employ a liquid cooling system to increase heat-radiation efficiency by circulating a coolant. Furthermore, in order to improve the cooling efficiency, it is desirable to include a cooling structure that a plurality of laser-light emitting units are arranged in a layout on a driving substrate, heat release from each light emitting unit is distributed, and each light emitting unit is kept at an optimal temperature.

For downsizing and heat release of a laser light-source apparatus, an apparatus in which a semiconductor laser light-source module is installed on a driving circuit board is proposed in Japanese Patent Application Laid-open No. H7-178957. A method disclosed in FIG. 1 and page 1 of this Patent Document No. H7-178957 is a method of releasing heat by mounting a semiconductor laser light source on a metal pattern on a substrate.

However, according to the above conventional technology, there is a problem that when a laser output is high and the amount of heat generation is increasing, heat radiation with a metal pattern on a substrate is insufficient, so that it is difficult to keep a heat generating unit at an optimal temperature.

SUMMARY OF THE INVENTION

It is an object of the present invention to at least partially solve the problems in the conventional technology.

In order to solve the aforementioned problems, a laser light-source apparatus according to one aspect of the present invention is constructed in such a manner as to include: a circuit board; a thermal insulation spacer placed on the circuit board; a heat receiving plate that is placed on the thermal insulation spacer, and thermally separated from the circuit board; a laser light-source module that is mounted on the heat receiving plate so as to be thermally connected to the heat receiving plate, and driven by being electrically connected the circuit board; and a heat sink that is thermally connected to the heat receiving plate via a heat pipe.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a laser light-source apparatus and a projector apparatus according to the present invention will be explained below in detail with reference to the accompanying drawings. The present invention is not limited by the embodiments.

Figure 1:
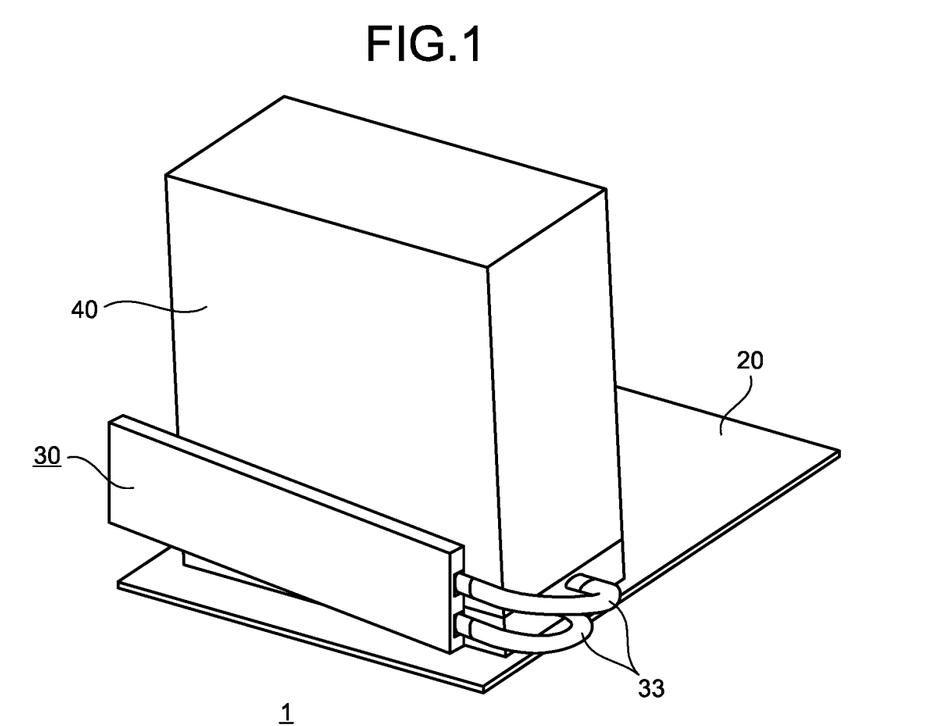
FIG. 1 is a perspective view of a general configuration of a laser light-source apparatus according to an embodiment of the present invention.

FIG. 1 is a perspective view of a general configuration of a laser light-source apparatus according to one embodiment of the present invention. On a laser light-source apparatus 1, a composite optical-system unit 40 is mounted on a laser-driving circuit board 20, and a radiator 30 that includes a heat pipe 33 (first heat pipe) lies therebetween.

Figure 2:
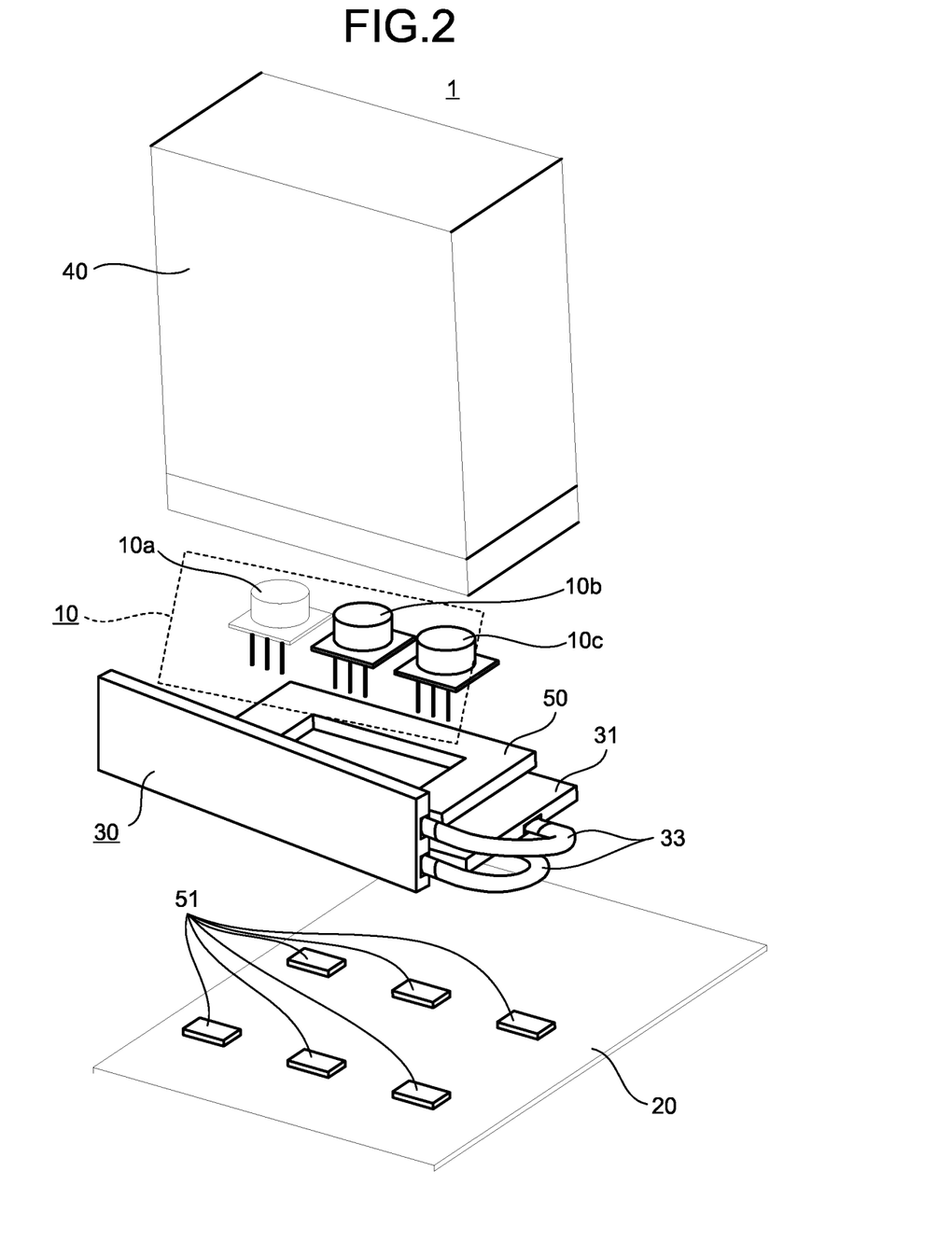
FIG. 2 is an exploded perspective view of the laser light-source apparatus according to the embodiment.

FIG. 2 is an exploded perspective view of the laser light-source apparatus 1. The laser light-source apparatus 1 includes a green-laser light-source module 10a that emits green laser light, a red-laser light-source module 10b that emits red laser light, and a blue-laser light-source module 10c that emits blue laser light. In the following explanations, the respective three color modules are collectively referred to as laser ht-source module 10.

The laser-driving circuit board 20 is a laser-driving circuit board in common use to the green-laser light-source module 10a, the red-laser light-source module 10b, and the blue-laser light-source module 10c.

A radiator 30 includes a heat receiving plate 31, the heat pipe 33, and the like, and cools the laser light-source module 10, thereby to control its temperature to be constant.

The composite optical-system unit 40 combines three color laser lights of green, red, and blue, emitted from the laser light-source module 10, and emits a composite light of the colors along a single light axis.

A thermal insulator 50 is a thermal insulator arranged on a side of the heat receiving plate 31 facing to the composite optical-system unit 40, and thermally insulates the composite optical-system unit 40 from the heat receiving plate 31. The thermal insulator 50 has a shape along the periphery of the heat receiving plate 31, and is arranged around the laser light-source module 10.

Moreover, thermal insulators 51 is a thermal insulator arranged on a side of the heat receiving plate 31 facing to the laser-driving circuit board 20, and thermally insulate the heat receiving plate 31 from the laser-driving circuit board 20. The thermal insulators 51 are arranged at six positions, namely, four corners of the heat receiving plate 31 and the middle of longer sides of the periphery of the heat receiving plate 31.

Figure 3:
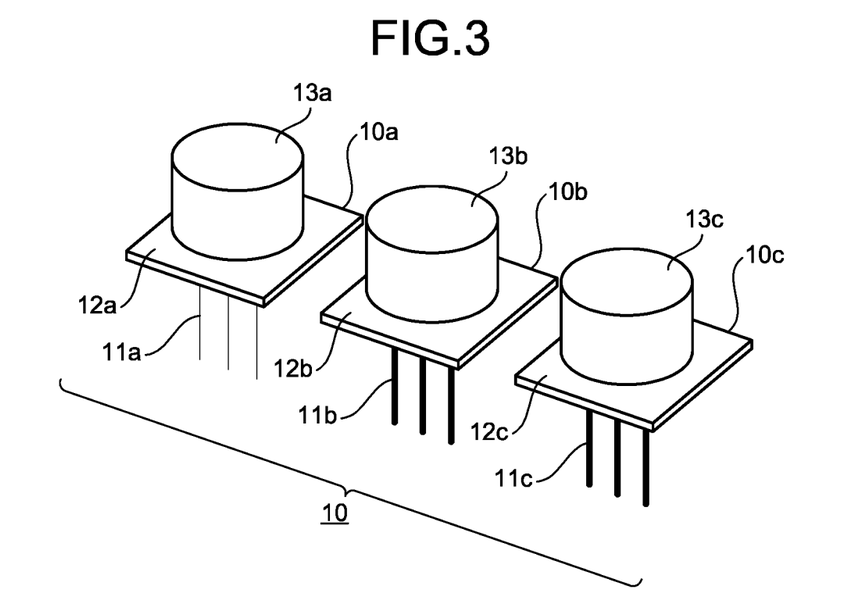
FIG. 3 is a schematic diagram of a configuration of a laser light-source module of the laser light-source apparatus according to the embodiment.

FIG. 3 is a schematic diagram of a configuration of the laser light-source module 10. The green-laser light-source module 10a includes a green laser cap 13a on a green laser substrate 12a on which a laser element is mounted, and is configured to seal the laser element part not to be exposed to outside air. Moreover, the green-laser light-source module 10a includes green laser terminals 11a, and is connected to the laser-driving circuit board 20 by soldering.

The red-laser light-source module 10b includes a red laser cap 13b on a red laser substrate 12b on which a laser element is mounted, and is configured to seal the laser element part not to be exposed to outside air. Moreover, the red-laser light-source module 10b includes red laser terminals 11b, and is connected to the laser-driving circuit board 20 by soldering.

The blue-laser light-source module 10c includes a blue laser cap 13c on a blue laser substrate 12c on which a laser element is mounted, and is configured to seal the laser element part not to be exposed to outside air. Moreover, the blue-laser light-source module 10c includes blue laser terminals 11c, and is connected to the laser-driving circuit board 20 by soldering.

Figure 4:
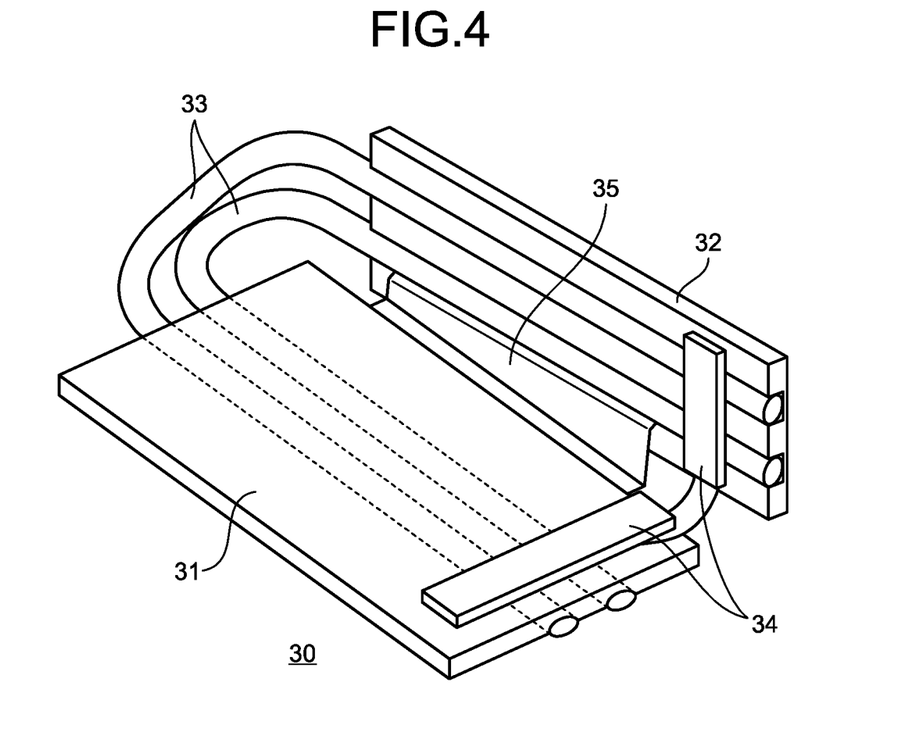
FIG. 4 is a schematic diagram of a configuration of a radiator of the laser light-source apparatus according to the embodiment.

FIG. 4 depicts a configuration of the radiator 30. The radiator 30 includes the heat receiving plate 31, a heat sink 32, the heat pipe 33, a heat pipe 34 (second heat pipe), and a holder plate 35.

The heat receiving plate 31 is in contact with the green laser substrate 12a, the red laser substrate 12b, and the blue laser substrate 12c, and receives heat generated in the laser light-source module 10.

Each of the heat pipes 33 and 34 is a metal pipe inside of which a coolant is filled, and is processed by bending in order to keep positional relation between parts connected to the both ends thereof. Each of the heat pipes 33 and 34 is added with rigidity by the holder plate 35 in order to prevent deformation in a bent shape of the pipe and to suppress any change in relative positional relationship between the heat receiving plate 31 and the heat sink 32.

According to this embodiment, the heat pipes 33 and 34 are arranged so as to connect the heat receiving plate 31 and the heat sink 32 in respectively different positions.

The heat pipe 33 is connected to inside of grooves by soldering, which are provided in each of the heat receiving plate 31 and the heat sink 32, and having a width substantially equal to the diameter of the heat pipe 33. The heat pipe 33 takes a route running from one shorter side of the heat receiving plate 31 and the heat sink 32 through the grooves provided in parallel with a longer side of the heat receiving plate 31 and the heat sink 32 to reach the other shorter side on the opposite side.

The heat pipe 34 is connected to both the heat receiving plate 31 and the heat sink 32 by soldering, and connected to the heat receiving plate 31 and the heat sink 32 in the vicinities of the shorter sides thereof at the ending sides of the heat pipe 33. The heat sink 32 is held by the holder plate 35 so as to be positioned higher than the heat receiving plate 31.

Inside the heat pipe 33 and the heat pipe 34, water as a coolant is filled in a decompressed state, and water that is a evaporated with heat generated by the heat receiving plate 31 moves upward inside the pipes. As the evaporated water is condensed in the vicinity of the heat sink 32, heat can be transported from the heat receiving plate 31 to the heat sink 32. The condensed water returns again toward the heat receiving plate 31 due to the difference in the height between the heat sink 32 and the heat receiving plate 31.

As the heat sink 32 includes an external cooling equipment such as a Peltier element, the heat sink 32 is cooled to keep its temperature constant, thereby cooling heat generated in the laser light-source module 10.

Figure 5:
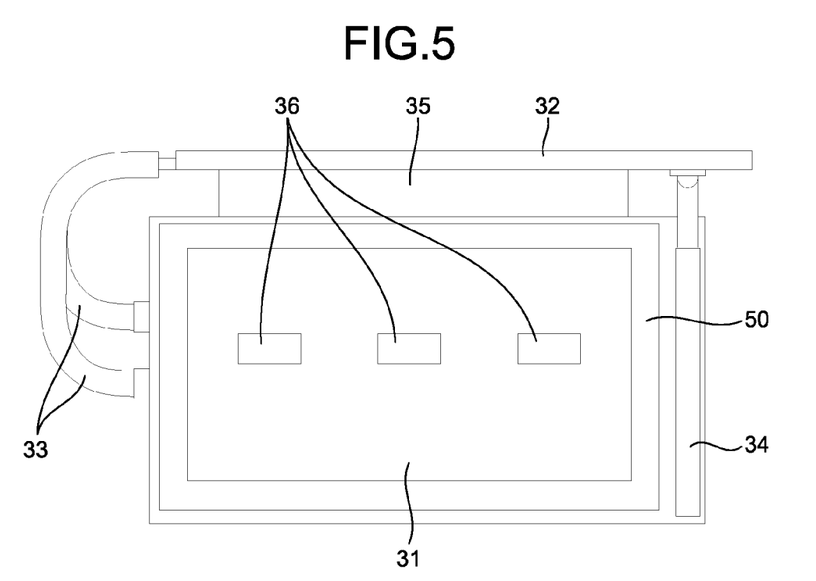
FIG. 5 is a top view of a heat sink of the radiator of the laser light-source apparatus according to the embodiment.

FIG. 5 is a top view of the heat receiving plate 31 of the radiator 30. The heat receiving plate 31 is provided with laser terminal holes 36 for letting the green laser terminals 11a, the red laser terminals 11b, and the blue laser terminals 11c pass through the holes.

The green-laser light-source module 10a, the red-laser light-source module 10b, and the blue-laser light-source module 10c are mounted such that the green laser substrate 12a, the red laser substrate 12b, and the blue laser substrate 12c are brought into contact with the heat receiving plate 31, respectively. The green laser terminals 11a, the red laser terminals 11b, and the blue laser terminals 11c penetrate the heat receiving plate 31 through the laser terminal holes 36, and are connected to the laser-driving circuit board 20. Further, a contact part between the heat receiving plate 31 and each of the laser substrates 12a, 12b, and 12c, and the laser terminal holes 36 constitute a mounting unit for mounting each of the laser light-source modules 10a, 10b, and 10c. Moreover, grooves to which two pipes constituting the heat pipe 33 are connected are formed on the both side of the laser terminal holes 36. For this reason, when the two pipes of the heat pipe 33 are connected to the grooves, the mounting unit is arranged adjacent to the two pipes in a region between the two pipes of the heat pipe 33.

The thermal insulator 50 is arranged around the laser light-source module 10 along the upper outer periphery of the heat receiving plate 31. The composite optical-system unit 40 is mounted via the thermal insulator 50.

The laser light-source module 10 needs to be cooled so as to keep the temperature constant, because if the temperatures varies, wavelengths and strengths of output lights also vary. The laser light-source module 10 is in contact with the heat receiving plate 31, and the temperature of the laser light-source module 10 on the heat receiving plate 31 can be controlled by cooling the heat sink 32. However, it is advantageous if a heat capacity of a system thermally connected to the heat receiving plate 31 is small, in order to keep the temperature of the laser light-source module 10 constant.

Figure 6:
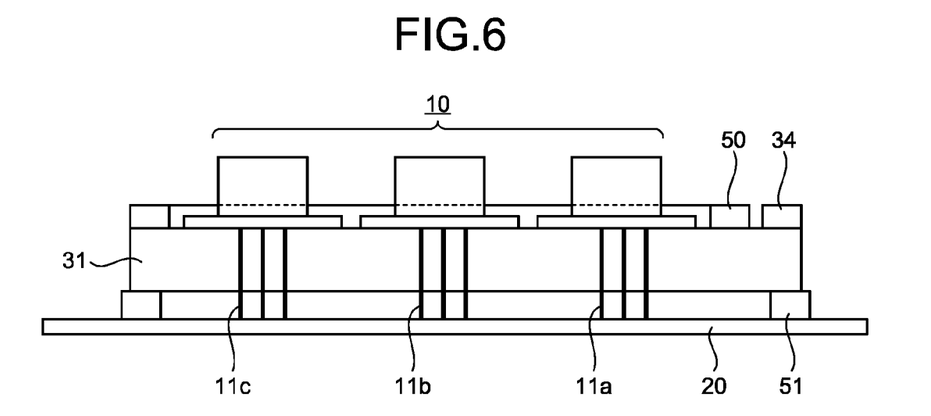
FIG. 6 is a cross-sectional view of the heat sink of the radiator of the laser light-source apparatus according to the embodiment.

FIG. 6 is a cross-sectional view of the heat receiving plate 31 of the radiator 30, and there is a space between the laser-driving circuit board 20 and the heat receiving plate 31, because the thermal insulators 51 are mounted as a spacer in four corners of the heat receiving plate 31 and in the middle of the longer sides of the outer periphery of the heat receiving plate 31. By thermally insulating the heat receiving plate 31 with the space from the laser-driving circuit board 20, the heat capacity of the system thermally connected to the heat receiving plate 31 becomes small, so that an effect of cooling the temperature of the laser light-source module 10 to be constant is increased.

Moreover, to keep the temperature of the laser light-source module 10 constant, it is desirable to prevent heat from transferring also between the composite optical-system unit 40 and the heat receiving plate 31. Between the composite optical-system unit 40 and the heat receiving plate 31, the thermal insulator 50 is inserted, and arranged on the heat receiving plate 31 and around the laser light-source module 10, as shown in FIG. 6. Accordingly, the structure of the composite optical-system unit 40 is such that it is incorporated with the heat receiving plate 31 via the thermal insulator 50. However, since it is thermally insulated with the thermal insulator 50, the heat capacity of the system thermally connected to the heat receiving plate 31 becomes small, and an effect of keeping the temperature of the laser light-source module 10 constant is thus increased.

Figure 7:
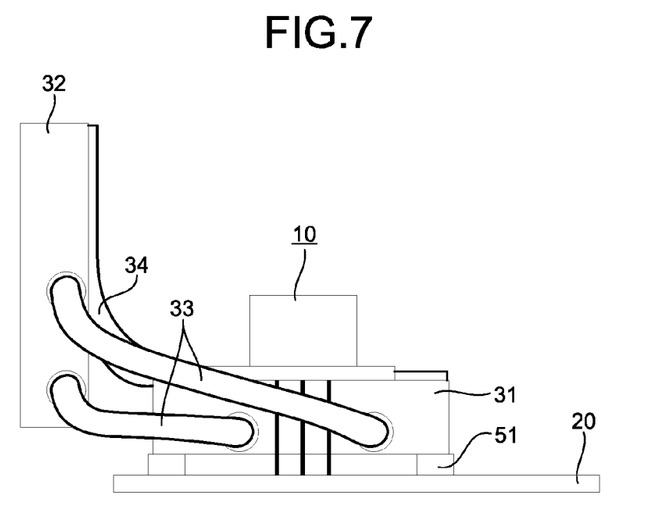
FIG. 7 is a side view of the radiator and a laser-driving circuit board of the laser light-source apparatus according to the embodiment.

FIG. 7 is a side view of the radiator 30 and the laser-driving circuit board 20. The thermal insulator 50 is omitted and not shown in FIG. 7. The heat sink 32 is in a positional relation orthogonal to the heat receiving plate 31, connected to the heat pipe 33 and the heat pipe 34 on the plane on a side facing to the heat receiving plate 31, and another plane on the side opposite to the side of the heat receiving plate 31 is cooled to a certain temperature by an external cooling device, such as a Peltier element. In order to avoid such a problem that cooling causes condensation on the heat sink 32, and a water droplet drops on the laser-driving circuit board 20, to cause an electrical short circuit, the position of the heat sink 32 is located at a distance from the position directly above the laser-driving circuit board 20 (outside the substrate surface of the laser-driving circuit board 20).

Figure 8:
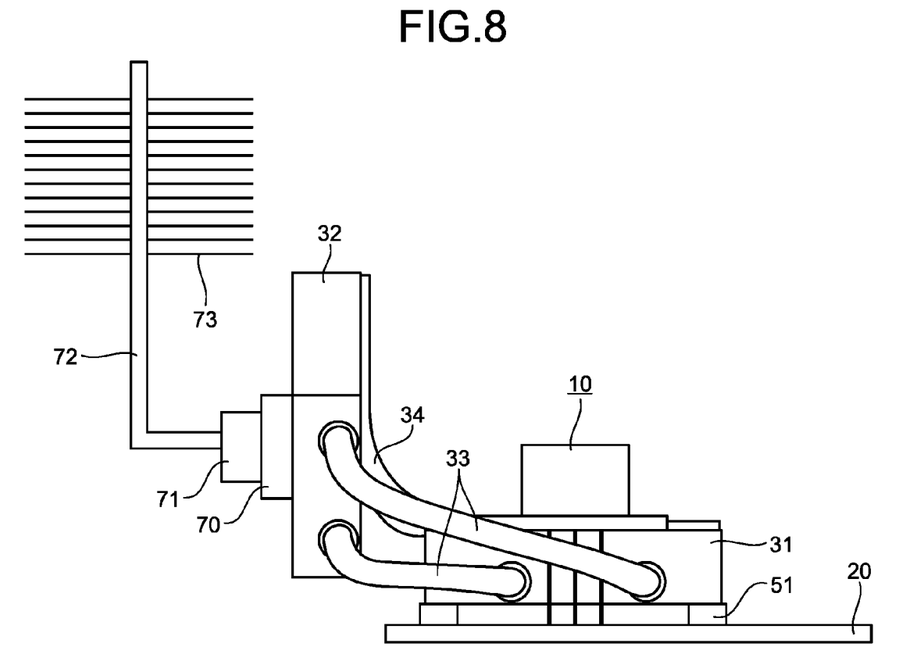
FIG. 8 is a configuration diagram of the radiator of the laser light-source apparatus according to the embodiment, including an external cooling device.

FIG. 8 is a configuration diagram of the radiator 30 including an external cooling device, and a Peltier element is used as the external cooling device. The thermal insulator 50 is omitted and not shown similarly to FIG. 7. It is a structure in which the temperature of the laser light-source module 10 can be controlled by cooling the heat sink 32, and the heat sink 32 is cooled by a Pettier element 70 mounted to the heat sink 32.

The Peltier element 70 is an element whose one side plane is endothermic, and the other side plane is exothermic, and it is controlled with a direct current. The endothermic plane of the Peltier element 70 is connected to the heat sink 32, and controls so as to cool the heat sink 32 at a certain temperature. The exothermic plane of the Peltier element 70 is cooled by a Peltier-element heat-receiving plate 71, a Peltier-element heat pipe 72, and a Peltier-element heat sink 73. The Peltier-element heat-receiving plate 71 is a heat receiving plate connected to the exothermic plane of the Peltier element 70, and receives heat generated on the exothermic plane of the Peltier element 70. The Peltier-element heat pipe 72 is a heat pipe connected to the Peltier-element heat-receiving plate 71 and the Peltier-element heat sink 73 at its respective ends, and transfers heat of the Peltier-element heat-receiving plate 71 to the Pettier-element heat sink 73. The Peltier-element heat sink 73 has a configuration that a plurality of metal plates is arranged in parallel, and is a heat exchanger that dissipates heat by diffusing heat. According to this configuration, the heat generated in the laser light-source module 10 is received by the heat receiving plate 31, and transferred to the heat sink 32 via the heat pipe 33 and 34. The heat sink 32 is cooled with the cooling surface of the Peltier element 70, and controlled to be a certain temperature. The heat generated by the exothermic plane of the Peltier element 70 is received by the Peltier-element heat-receiving plate 71, transferred to the Peltier-element heat sink 73 via the Peltier-element heat pipe 72, and released by thermal diffusion.

The heat pipe 33 has a route that passes through the vicinity of contact points with all of the laser substrates of the laser light-source module 10 on the heat receiving plate 31. Such an arrangement is effective to cool all the laser light-source modules simultaneously. However, when the amount of heat generated by the laser light-source module 10 is large, water filled inside the heat pipe 33 is all evaporated, and water does not reach the vicinity of the green-laser light-source module 10a, so that the efficiency of thermal transfer declines.

For this reason, the route of the heat pipe 34 is different from the route of the heat pipe 33. The heat pipe 34 directly connects the heat sink and the vicinity of the green-laser light-source module 10a at the end of the heat pipe 33 on the side of the heat receiving plate 31. Accordingly, it is unlikely that water inside the heat pipe 33 is all evaporated and causes a state that no water reaches a laser light-source module. Consequently, the efficiency of thermal transfer can be improved. Specifically, it can be achieved by connecting the heat pipe 34 to a position on the heat receiving plate 31 from which a distance to a laser light-source module arranged most closely to the end of the heat pipe 33 on the side of the heat receiving plate 31 is to be shorter than distances to the other laser light-source modules included in the laser light-source module 10.

Also when the route of the heat pipe 34 is not the route that connects the heat sink 32 to the vicinity of the end of the heat pipe 33 on the side of the heat receiving plate 31, but the route that connects the heat sink 32 to the vicinity of a laser light-source module having the largest amount of heat generation among the laser light-source module 10; the amount of evaporation of water inside the heat pipe 33 can be reduced, so that the efficiency of thermal transfer can be improved. Specifically, by connecting the heat pipe 34 to a position on the heat receiving plate 31 from which a distance to a laser light-source module having the largest amount of heat generation to be shorter than distances to the other laser light-source modules included in the laser light-source module 10, heat from the laser light-source module having the largest amount of heat generation can be preferentially transferred to the heat pipe 34.

The holder plate 35 is a member that reinforces the structure of the radiator 30, and prevents a change in positional relationship between the heat receiving plate 31 and the heat sink 32 as the heat pipe 33 deforms. By using a metal member having a high thermal conductivity, such as copper or aluminum, as a material of the holder plate 35, thermal transfer from the heat receiving plate 31 to the heat sink 32 is also performed by the holder plate 35 in addition to the heat pipes 33 and 34. Therefore, the efficiency of thermal transfer is improved, and the laser light-source module 10 can be cooled more effectively. Not limited to metals, such as copper or aluminum as described above in the example, an effect of improving the efficiency of thermal transfer can be obtained with any material, as long as it can thermally connect the heat receiving plate 31 and the heat sink 32.

Figure 9:
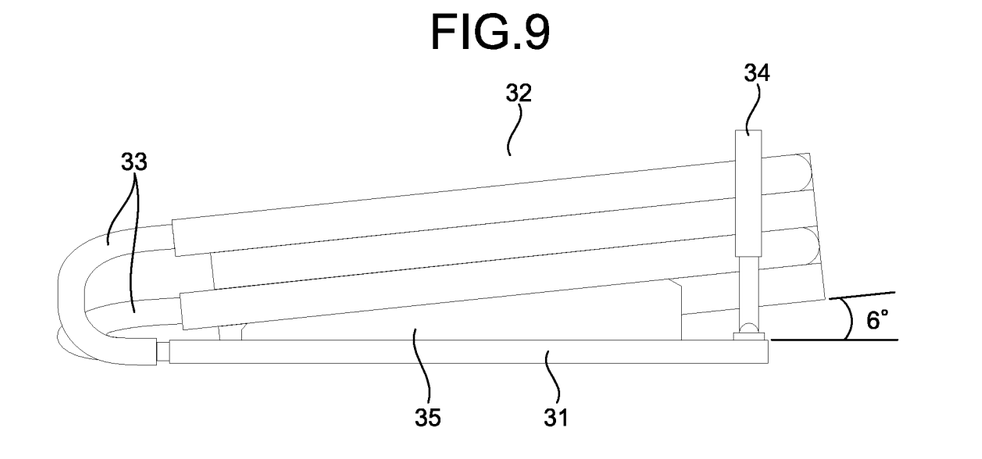
FIG. 9 is a front view of the heat sink of the radiator of the laser light-source apparatus according to the embodiment.

FIG. 9 depicts a front view of the heat sink 32. The heat sink 32 is tilted by six degrees from the horizontal direction, and the end of the heat pipe 33 on the side of the heat sink 32 is positioned upper than the other end on the side of the heat receiving plate 31. To operate the heat pipe 33, water cooled and condensed on the side of the heat sink 32 needs to return to the side of the heat receiving plate 31. For this reason, cooling operation is available when the heat pipe 33 operates in a state that the heat pipe of the side to be connected to the heat sink 32 is positioned higher than the side to be connected to the heat receiving plate 31, and a tilt angle of the laser light-source apparatus is less than six degrees in such configuration.

Figure 10:
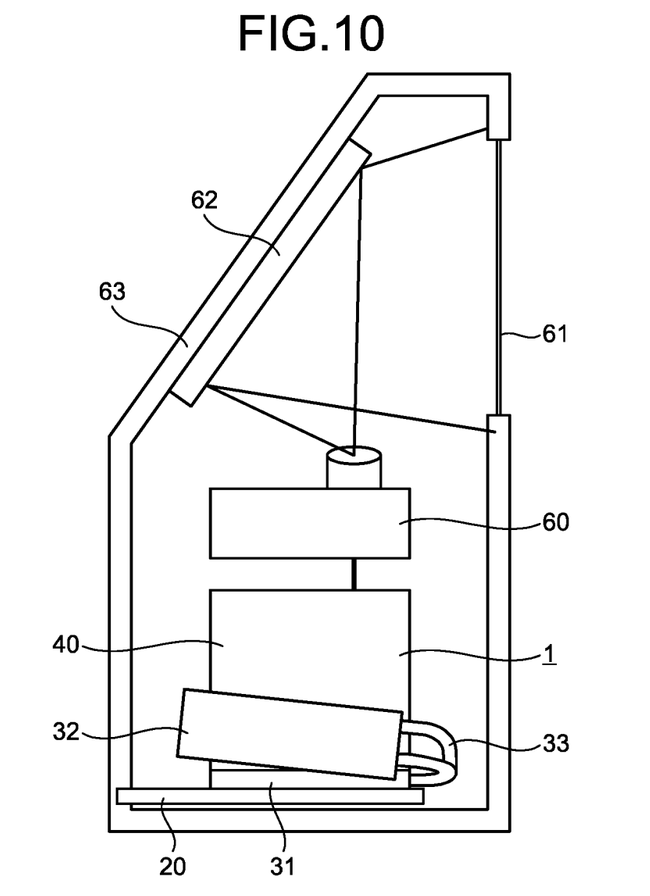
FIG. 10 is a configuration diagram of a rear projector device equipped with the laser light-source apparatus according to the embodiment.

FIG. 10 is a configuration diagram of a rear projector device equipped with the laser light-source apparatus. The laser light-source apparatus 1 emits a composite light, in which a green laser, a red laser, and a blue laser are combined, and the light comes in to a projective display device 60. The projective display device 60 projects an image in an enlarged manner, and a projected image is reflected by a reflective mirror 62, and an image is formed on a transparent screen 61. Components are held inside the rear-projector apparatus housing 63.

The laser light-source apparatus 1 is arranged so as to have a configuration that the heat receiving plate 31 is placed in parallel with the bottom surface of the rear-projector apparatus, the heat sink 32 is to be perpendicular to the transparent screen 61, and its side on the back side of the rear-projector apparatus is elevated.

In the rear-projector apparatus, a tilt in the forward-and-backward direction not exceeding five degrees sometimes occurs depending on a situation of a placement surface in some cases. Even when it is tilted by five degrees in the forward-and-backward direction, the heat sink 32 is tilted by six degrees, so that the heat pipe 33 can still operate, and cooling of the laser light-source module 10 can be normally carried out. Although a state of the heat sink 32 tilted by 90 degrees in the horizontal direction can cope with a larger tilt of the rear-projector apparatus, to make the rear-projector apparatus compact, making the tilt an angle smaller than 90 degrees is often advantageous. In such case, by tilting the heat sink by a larger angle than a tilt angle expected to occur in the rear-projector apparatus, the laser light-source apparatus 1 can be normally cooled.

In this way, according to the embodiment, because the laser light-source module 10 is mounted on the heat receiving plate 31, the temperature of the laser light-source module 10 can be controlled by cooling the heat receiving plate 31. Moreover, because the heat receiving plate 31 and the laser-driving circuit board 20 are thermally insulated from each other in structure, the heat capacity of the system thermally connected to the heat receiving plate 31 is made small, and its temperature can be readily controlled.

According to the embodiment of the present invention, the heat receiving plate and the laser-driving circuit board are thermally insulated from each other, so that the heat capacity of a part thermally connected to the heat receiving plate is made small, and the temperature can be easily controlled.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A laser light-source apparatus comprising:
    a circuit board;
    a thermal insulation spacer placed on the circuit board;
    a heat receiving plate that is placed on the thermal insulation spacer, and thermally separated from the circuit board;
    a laser light-source module that is mounted on the heat receiving plate so as to be thermally connected to the heat receiving plate, and driven by being electrically connected the circuit board;
    a heat sink that is thermally connected to the heat receiving plate via a first heat pipe and a second heat pipe, the first heat pipe being partially set in grooves in both the heat sink and heat receiving plate, and the second heat pipe connected to the heat sink and said heat receiving plate so as to be orthogonal to the first heat pipe; and
    a holder plate that holds the heat sink so as to be positioned higher than the heat receiving plate, wherein
    the first heat pipe and second heat pipe respectively contains water as a coolant in a decompressed state;
    the heat receiving plate is configured to evaporate the water with heat generated thereby so as to move the water upward inside the first heat pipe and second heat pipe; and
    the heat sink is configured to condense the evaporated water in the vicinity thereof so that the heat is transported from the heat receiving plate to the heat sink, and to return the condensed water again toward the heat receiving plate due to the difference in the height between the heat sink and the heat receiving plate.

2. The laser light-source apparatus according to claim 1, wherein the heat sink is arranged outside a substrate surface of the circuit board.

3. The laser light-source apparatus according to claim 1, wherein the heat sink is arranged so as to be orthogonal to the heat receiving plate and tilted such that an end of the heat pipe is to be positioned upper than the heat receiving plate.

4. The laser light-source apparatus according to claim 1, further comprising a member that suppresses a change in the relative positional relation between the heat receiving plate and the heat sink.

5. The laser light-source apparatus according to claim 1, wherein
    the laser light-source apparatus includes a plurality laser light-source modules,
    the first heat pipe is placed so as to pass through the vicinity of all of the laser light-source modules, and
    the second heat pipe is placed so as to run through only one of the vicinity of a laser light-source module installed at an end side of the heat pipe running through all of the laser light-source modules, and the vicinity of a laser light-source module having a largest amount of heat generation among the laser light-source modules.

6. The laser light-source apparatus according to claim 5, further comprising:
    a composite optical system that combines laser lights emitted from respective laser light-source modules; and
    a thermal insulator that lies between the composite optical system and the heat receiving plate, and thermally insulates the composite optical system and the heat receiving plate.

7. The laser light-source apparatus according to claim 1, wherein
    the laser light-source module includes a plurality of laser light-source modules,
    the first heat pipe is arranged in adjacent to a mounting part of the heat receiving plate onto which the plurality of laser light-source modules are to be mounted, and
    the second heat pipe is arranged in a position at which a laser light-source module having a longest distance to reach the heat sink along the first heat pipe among the plurality of laser light-source modules is closer than other laser light-source modules.

8. The laser light-source apparatus according to claim 1, wherein
    the laser light-source module includes a plurality of laser light-source modules,
    the first heat pipe is arranged in adjacent to a mounting part of the heat receiving plate onto which the plurality of laser light-source modules are to be mounted, and the second heat pipe is arranged in a position from which a distance to a laser light-source module having a largest amount of heat generation among the plurality of laser light-source modules is shorter than distances to other laser light-source modules.

9. A projector apparatus comprising:
a laser light-source apparatus;
a image-light creating unit that creates image light by spatially modulating laser light emitted by the laser light-source apparatus; and
a projection optical system that projects the image light,
wherein the laser light-source apparatus further comprises:
a circuit board;
a thermal insulation spacer placed on the circuit board;
a heat receiving plate that is placed on the thermal insulation spacer, and thermally separated from the circuit board;
a laser light-source module that is mounted on the heat receiving plate so as to be thermally connected to the heat receiving plate, and driven by being electrically connected the circuit board;
a heat sink that is thermally connected to the heat receiving plate via a first heat pipe and a second heat pipe, the first heat pipe being partially set in grooves in both the heat sink and heat receiving plate, and the second heat pipe connected to the heat sink and said heat receiving plate so as to be orthogonal to the first heat pipe; and
a holder plate that holds the heat sink so as to be positioned higher than the heat receiving plate, wherein
the first heat pipe and second heat pipe respectively contains water as a coolant in a decompressed state;
the heat receiving plate is configured to evaporate the water with heat generated thereby so as to move the water upward inside the first heat pipe and second heat pipe; and
the heat sink is configured to condense the evaporated water in the vicinity thereof so that the heat is transported from the heat receiving plate to the heat sink, and to return the condensed water again toward the heat receiving plate due to the difference in the height between the heat sink and the heat receiving plate.

* * * * *